(12) United States Patent
Popescu et al.

(10) Patent No.: US 10,330,717 B2
(45) Date of Patent: Jun. 25, 2019

(54) MEASURING SUPERCAPACITOR DEGRADATION DOWNHOLE

(71) Applicant: HALLIBURTON ENERGY SERVICES, INC., Houston, TX (US)

(72) Inventors: Lucian Popescu, Houston, TX (US); Burjis H. Cooper, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 41 days.

(21) Appl. No.: 15/301,313

(22) PCT Filed: Oct. 7, 2015

(86) PCT No.: PCT/US2015/054423
§ 371 (c)(1),
(2) Date: Sep. 30, 2016

(87) PCT Pub. No.: WO2017/061999
PCT Pub. Date: Apr. 13, 2017

(65) Prior Publication Data
US 2017/0269140 A1 Sep. 21, 2017

(51) Int. Cl.
*G01R 31/12* (2006.01)
*G01R 31/02* (2006.01)
*E21B 47/01* (2012.01)
*E21B 41/00* (2006.01)
*E21B 47/00* (2012.01)
*G01R 27/14* (2006.01)
(Continued)

(52) U.S. Cl.
CPC ........ *G01R 31/028* (2013.01); *E21B 41/0085* (2013.01); *E21B 47/00* (2013.01); *E21B 47/01* (2013.01); *E21B 47/06* (2013.01); *G01R 27/14* (2013.01); *G01R 27/2605* (2013.01); *G01R 31/36* (2013.01); *G01R 31/44* (2013.01)

(58) Field of Classification Search
CPC .. G01R 31/016; G01R 31/028; G01R 31/002; G01R 31/00
USPC ......... 324/71, 378, 403, 415, 425, 500, 537, 324/548
See application file for complete search history.

(56) References Cited

U.S. PATENT DOCUMENTS 7,395,163 B1 7/2008 Morrison et al.
7,675,293 B2 3/2010 Christophersen et al.
(Continued)

OTHER PUBLICATIONS

Christophersen, Impedance Measurement Box, 2011, 2 pages.
(Continued)

*Primary Examiner* — Huy Q Phan
*Assistant Examiner* — Raul J Rios Russo
(74) *Attorney, Agent, or Firm* — Kilpatrick Townsend and Stockton LLP

(57) ABSTRACT

A system for use in a wellbore can include a supercapacitor health measurement device including circuitry for determining a capacitance of a supercapacitor that is positionable in the wellbore. The supercapacitor health measurement device can also include circuitry for determining an equivalent series resistance (ESR) value of the supercapacitor. The supercapacitor health measurement device can further include circuitry for transmitting the capacitance and the ESR value. The system can also include a remote device that is positionable aboveground for receiving the capacitance and ESR value.

27 Claims, 6 Drawing Sheets

(51) Int. Cl.
*G01R 27/26* (2006.01)
*E21B 47/06* (2012.01)
*G01R 31/36* (2019.01)
*G01R 31/44* (2006.01)

(56) References Cited

U.S. PATENT DOCUMENTS

| | | |
|---|---|---|
| 2003/0048697 A1 | 3/2003 | Hirsch et al. |
| 2003/0169022 A1* | 9/2003 | Turner ................ G06F 1/30 320/166 |
| 2004/0095098 A1* | 5/2004 | Turner ................ H02J 7/345 320/167 |
| 2005/0058885 A1 | 3/2005 | Brocklin et al. |
| 2006/0264188 A1* | 11/2006 | Mars ................ H03F 1/0211 455/127.1 |
| 2011/0031811 A1* | 2/2011 | Park ................ H02J 7/345 307/66 |
| 2011/0153240 A1 | 6/2011 | Benckenstein, Jr. et al. |
| 2011/0168380 A1 | 7/2011 | Osmundsen et al. |
| 2011/0193515 A1* | 8/2011 | Wu ................ H02J 7/35 320/101 |
| 2012/0123508 A1* | 5/2012 | Wentz ................ A61N 1/3787 607/88 |
| 2015/0007975 A1 | 1/2015 | McMillon et al. |
| 2017/0063106 A1* | 3/2017 | Armstrong ............ H02J 7/007 |
| 2017/0108552 A1* | 4/2017 | Roumi ................ G01R 31/025 |
| 2018/0358829 A1* | 12/2018 | Rastegar ................ H02J 7/0052 |

OTHER PUBLICATIONS

Grbovic et al., Ultra-Capacitors in Power Conversion Systems, Abstract, Oct. 2013, 3 pages.

Oakaour et al., Supercapacitors aging diagnosis using least square algorithm, 2016, 6 pages.

International Patent Application No. PCT/US2015/054423, International Search Report and Written Opinion, dated Jun. 29, 2016, 15 pages.

* cited by examiner

MEASURING SUPERCAPACITOR DEGRADATION DOWNHOLE

CROSS-REFERENCE TO RELATED APPLICATIONS

This is a U.S. national phase under 35 U.S.C. 371 of International Patent Application No. PCT/US2015/054423, titled "Measuring Supercapacitor Degradation Downhole" and filed Oct. 7, 2015, the entirety of which is incorporated herein by reference.

TECHNICAL FIELD

The present disclosure relates generally to devices for use in well systems. More specifically, but not by way of limitation, this disclosure relates to measuring supercapacitor degradation downhole.

BACKGROUND

A well system (e.g., an oil or gas well for extracting fluid or gas from a subterranean formation) can include various electrical devices in a wellbore. For example, a well system can include a sensor for detecting an environmental characteristic in the wellbore. The electrical devices can be powered by wirelines, generators, batteries, and supercapacitors. For example, an electrical device can be powered by a generator and include a supercapacitor as a back-up energy source. But harsh environmental conditions in the wellbore, such as high temperatures, can cause supercapacitors to fail. Failure of a supercapacitor can cause an associated electrical device to shut down or otherwise operate improperly.

DETAILED DESCRIPTION

Figure 1:
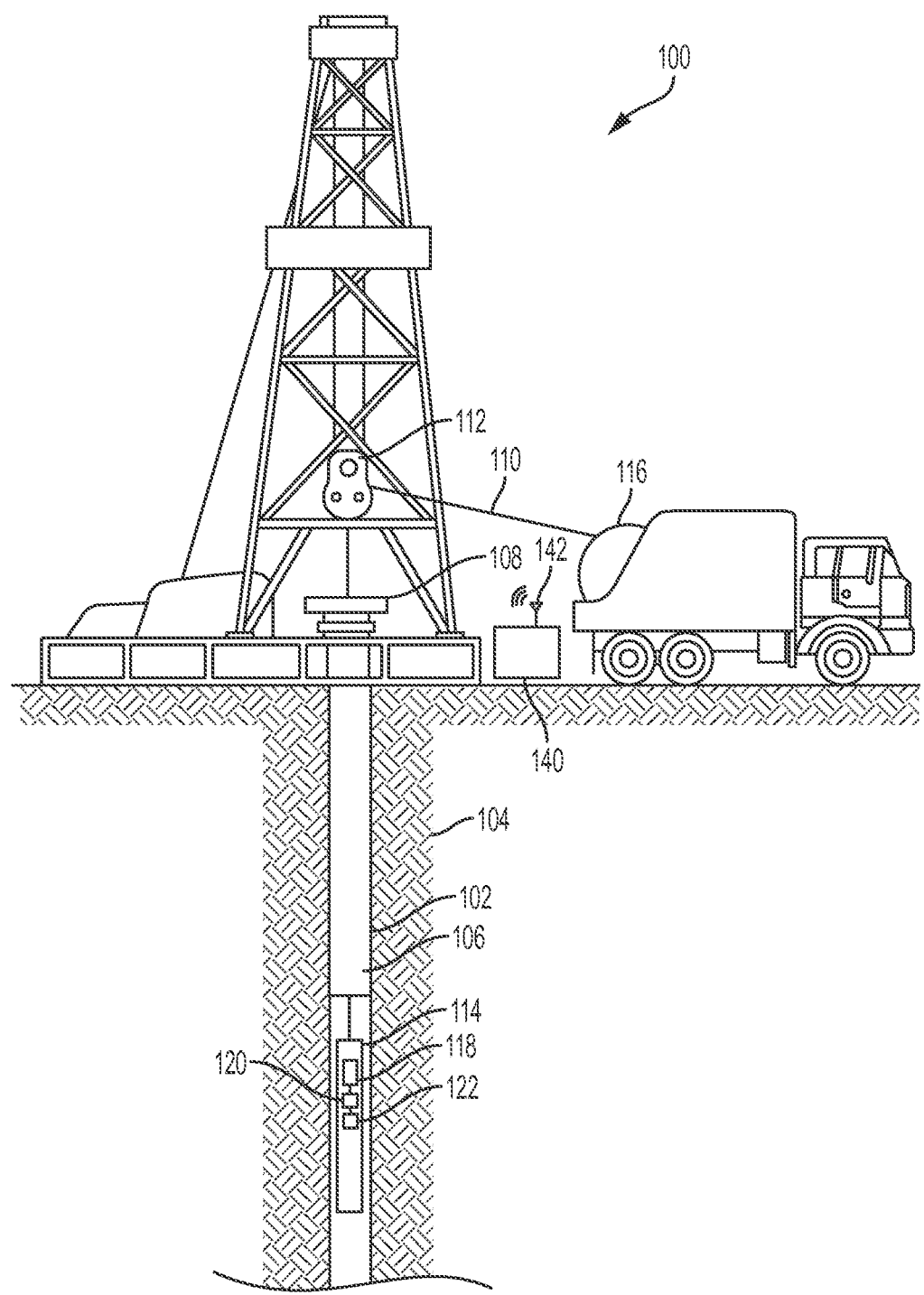
FIG. 1 is a cross-sectional view of an example of a well system that includes a system for measuring supercapacitor degradation downhole according to some aspects.

Certain aspects and features of the present disclosure relate to measuring supercapacitor degradation downhole. In some examples, a supercapacitor health measurement device can determine a capacitance of the supercapacitor and an equivalent series resistance (ESR) value of the supercapacitor and transmit the capacitance and the ESR value to a remote device. A well operator or the remote device can analyze the capacitance and ESR value to determine if the supercapacitor has failed, is approaching failure, or has otherwise degraded.

In some examples, the supercapacitor health measurement device can include a temperature sensor for detecting a temperature near the supercapacitor and a voltage measurement device for determining a voltage across the supercapacitor. The supercapacitor health measurement device can determine if the temperature exceeds a threshold, the voltage exceeds another threshold, or both. In some examples, if the temperature exceeds the threshold, or the voltage exceeds the other threshold, or both the temperature and the voltage exceed the respective thresholds, the supercapacitor health measurement device can determine the capacitance, the ESR value, or both. The supercapacitor health measurement device can additionally or alternatively determine the capacitance, the ESR value, or both at predetermined periodic intervals (e.g., once every minute, five minutes, half hour, day, week, etc.).

In some examples, the supercapacitor health measurement device can determine if the capacitance changes from a baseline capacitance value by an amount above a threshold. The supercapacitor health measurement device can additionally or alternatively determine if the ESR value changes from a baseline ESR value by an amount above another threshold. In some examples, if the capacitance changes from the baseline capacitance value by the amount above the threshold, the ESR value changes from the baseline ESR value by the amount above the other threshold, or both, the supercapacitor health measurement device can transmit the capacitance value, the ESR value, the temperature near the supercapacitor, the voltage across the supercapacitor, a warning notification, or any combination of these to the remote device.

In some examples, the supercapacitor health measurement device can determine a voltage across the supercapacitor at a start time. The supercapacitor health measurement device can determine another voltage across the supercapacitor at a later time. The supercapacitor health measurement device can subtract the voltage across the supercapacitor at the later time from the voltage across the supercapacitor at the start time to determine a change in the voltage over a period of time between the start time and the later time. In some examples, the supercapacitor health measurement device can determine an amount of current, via a current measurement device, output by the supercapacitor during the period of time. The amount of current can remain substantially constant over the period of time. The supercapacitor health measurement device can determine the capacitance by multiplying the amount of current with the period of time between the start time and the later time, and then dividing the product by the change in voltage.

In some examples, the supercapacitor health measurement device can determine a voltage across the supercapacitor at a start time. The supercapacitor health measurement device can also determine an amount of current output by the supercapacitor at the start time. The supercapacitor health measurement device can determine another voltage across the supercapacitor at a later time. The supercapacitor health measurement device can also determine another amount of current output by the supercapacitor at the later time. In some examples, the supercapacitor health measurement device can subtract the voltage across the supercapacitor at the later time from the voltage across the supercapacitor at the start time to determine a change in the voltage over a period of time between the start time and the later time. The supercapacitor health measurement device can subtract the amount of current output by the supercapacitor at the later time from the amount of current output by the supercapacitor at the start time to determine a change in the amount of current over the period of time. In some examples, the period of time can be selected to ensure that a meaningful change in the amount of current (e.g., a change of 0.5 amperes or more) occurs over the period of time. The supercapacitor health measurement device can divide the change in voltage by the change in the amount of current to determine the ESR value.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a cross-sectional view of an example of a well system 100 for measuring supercapacitor degradation downhole according to some aspects. The well system 100 includes a wellbore 102 extending through various earth strata. The wellbore 102 extends through a hydrocarbon bearing subterranean formation 104. A casing string 106 extends from the well surface 108 to the subterranean formation 104. The casing string 106 can provide a conduit through which formation fluids, such as production fluids produced from the subterranean formation 104, can travel from the wellbore 102 to the well surface 108. The casing string 106 can be coupled to the walls of the wellbore 102 via cement. For example, a cement sheath can be positioned or formed between the casing string 106 and the walls of the wellbore 102 for coupling the casing string 106 to the wellbore 102.

The well system 100 can include at least one well tool 114 (e.g., a formation-testing tool). The well tool 114 can be coupled to a wireline 110, slickline, or coiled tube that can be deployed into the wellbore 102. The wireline 110, slickline, or coiled tube can be guided into the wellbore 102 using, for example, a guide 112 or winch. In some examples, the wireline 110, slickline, or coiled tube can be wound around a reel 116.

The well tool 114 can include one or more electronic devices 118. The electronic devices 118 can include one or more sensors, valves, telemetry units, or any combination of these. The electronic devices 118 can be electrically coupled to a power source for powering the electronic devices 118. The power source can include a wireline, a battery, or both. In some examples, the power source can include a supercapacitor 120.

The well tool 114 can also include a supercapacitor health measurement device 122. The supercapacitor health measurement device 122 can determine various characteristics of the supercapacitor 120. For example, the supercapacitor health measurement device 122 can determine a capacitance of the supercapacitor 120, an ESR of the supercapacitor 120, a temperature of the supercapacitor 120 and/or a surrounding environment in the wellbore 102, or any combination of these. In some examples, the supercapacitor health measurement device 122 can determine if the supercapacitor 120 has failed or is approaching failure based on these characteristics. Additionally or alternatively, the supercapacitor health measurement device 122 can determine why the supercapacitor 120 failed based on these characteristics. In some examples, the supercapacitor health measurement device 122 can transmit, via a wired or wireless communications interface, data associated with the supercapacitor 120. For example, the supercapacitor health measurement device 122 can transmit a wireless signal to a computing device 140 indicating one or more characteristics of the supercapacitor 120, such as whether the supercapacitor 120 has failed or is approaching failure.

In some examples, the computing device 140 can be positioned on below ground, aboveground, or offsite. The computing device 140 can include a processor interfaced with other hardware via a bus. A memory, which can include any suitable tangible (and non-transitory) computer-readable medium, such as RAM, ROM, EEPROM, or the like, can embody program components that configure operation of the computing device 140. In some aspects, the computing device 140 can include input/output interface components (e.g., a display, printer, keyboard, touch-sensitive surface, and mouse) and additional storage.

The computing device 140 can include a communication device 142. The communication device 142 can represent one or more of any components that facilitate a network connection. In the example shown in FIG. 1, the communication device 142 is wireless and can include wireless interfaces such as IEEE 802.11, Bluetooth, or radio interfaces for accessing cellular telephone networks (e.g., transceiver/antenna for accessing a CDMA, GSM, UMTS, or other mobile communications network). In some examples, the communication device 142 can use acoustic waves, mud pulses, surface waves, vibrations, optical waves, or induction (e.g., magnetic induction) for engaging in wireless communications. In other examples, the communication device 142 can be wired and can include interfaces such as Ethernet, USB, IEEE 1394, or a fiber optic interface. The computing device 140 can receive wired or wireless communications from the capacitor health measurement device via the communication device 142 and perform one or more tasks based on the communications. For example, the computing device 140 can receive data associated with a capacitance of the supercapacitor 120, an ESR value of the supercapacitor 120, a temperature of the supercapacitor 120 and/or a surrounding environment in the wellbore 102, or any combination of these. The computing device 140 can output, via a display, printer, or other device, one or more of the capacitance, the ESR value, or the temperature.

Figure 2:
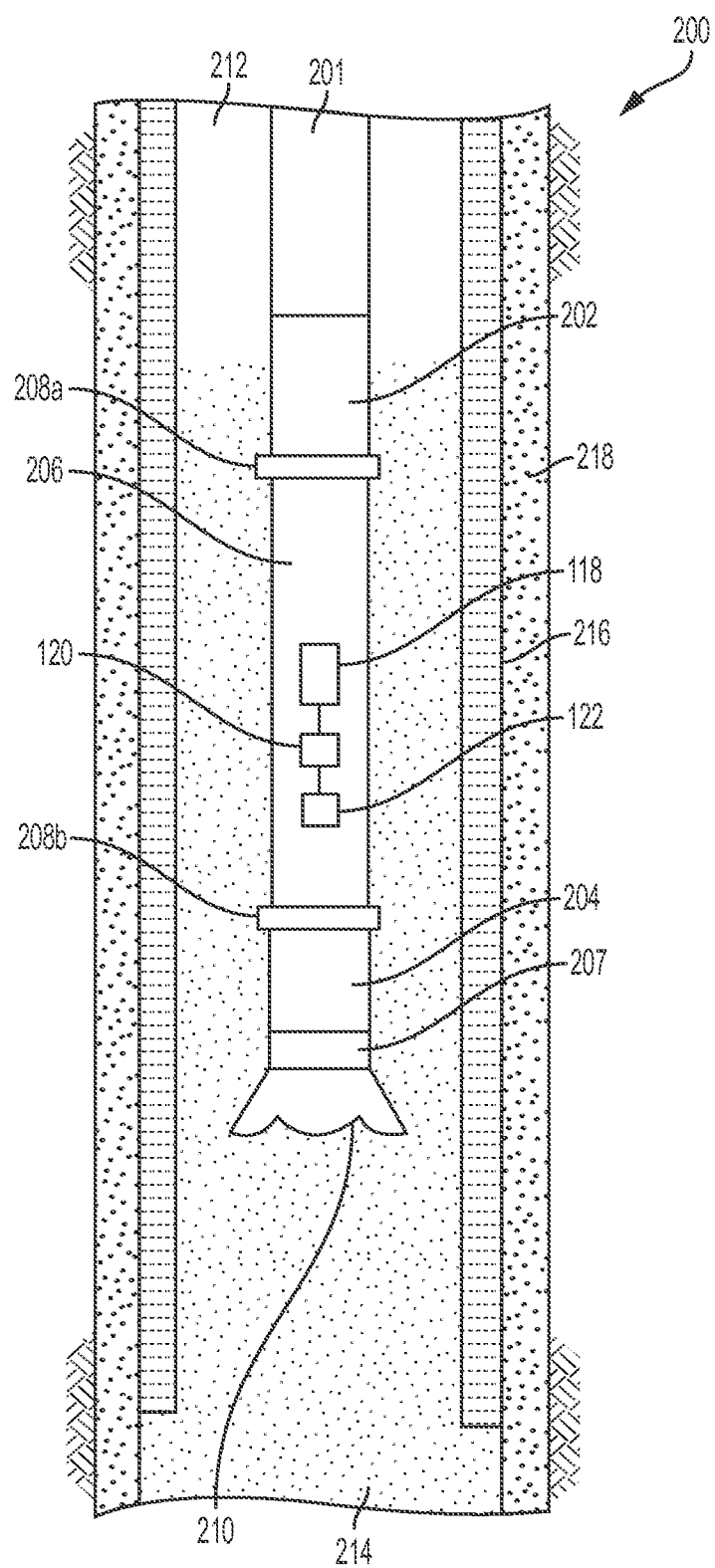
FIG. 2 is a cross-sectional view of an example of part of a well system that includes a system for measuring supercapacitor degradation according to some aspects.

FIG. 2 is a cross-sectional view of an example of part of a well system 200 that includes a system for measuring supercapacitor degradation according to some aspects. The well system 200 includes a wellbore. The wellbore can include a casing string 216 and a cement sheath 318. In some examples, the wellbore can include a fluid 214 (e.g., mud). The fluid 214 can flow in an annulus 212 positioned between the well tool 201 and a wall of the casing string 316.

A well tool 201 (e.g., logging-while-drilling tool) can be positioned in the wellbore. The well tool 201 can include various subsystems 202, 204, 206, 207. For example, the well tool 201 can include a subsystem 202 that includes a communication subsystem. The well tool 201 can also include a subsystem 204 that includes a saver subsystem or a rotary steerable system. A tubular section or an intermediate subsystem 206 (e.g., a mud motor or measuring-while-drilling module) can be positioned between the other subsystems 202, 204. In some examples, the well tool 201 can include a drill bit 210 for drilling the wellbore. The drill bit 210 can be coupled to another tubular section or intermediate subsystem 207 (e.g., a measuring-while-drilling module or a rotary steerable system). In some examples, the well tool 201 can also include tubular joints 208a, 208b.

The well tool 201 can include one or more electronic devices 118. A power source can be coupled to the electronic devices 118. For example, a supercapacitor 120 can be coupled to the electronic devices 118 for powering the electronic devices 118. In some examples, the well tool 201 can include a supercapacitor health measurement device 122 for detecting various characteristics of the supercapacitor 120. For example, the supercapacitor health measurement device 122 can detect whether the supercapacitor 120 has failed or is approaching failure. The supercapacitor health measurement device 122 can transmit a signal, via a wired or wireless interface, to a computing device (e.g., the computing device 140 of FIG. 1). The signal can be associated with the detected characteristics of the supercapacitor 120.

Figure 3:
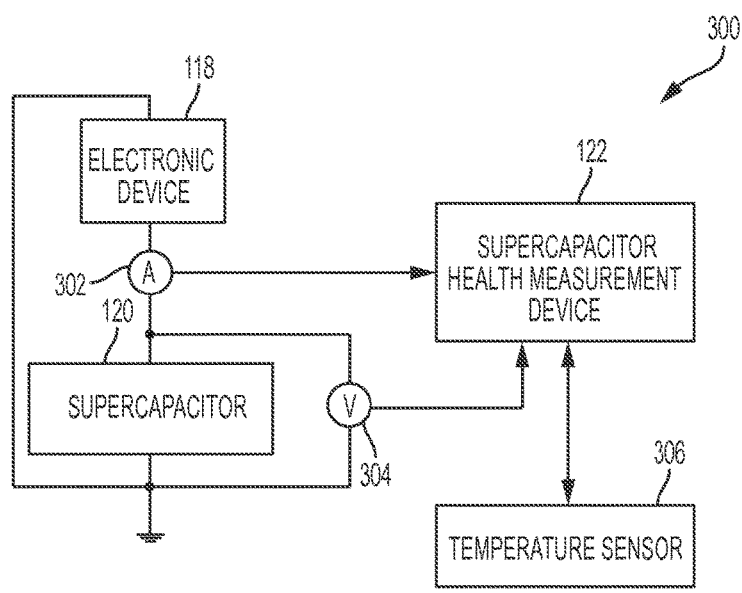
FIG. 3 is a block diagram of an example of a system for measuring supercapacitor degradation downhole according to some aspects.

FIG. 3 is a block diagram of an example of a system 300 for measuring supercapacitor degradation downhole according to some aspects. The system 300 includes a supercapacitor 120. In some examples, the system includes a current measurement device 302 (e.g., an ammeter). The current measurement device 302 can be electrically coupled in series with the supercapacitor 120. For example, the current measurement device 302 can be electrically coupled in series between the supercapacitor 120 an electronic device 118. The current measurement device 302 can detect an amount of current output by the supercapacitor 120 and transmit an associated signal to the supercapacitor health measurement device 122.

In some examples, the system 300 can include a voltage measurement device 304 (e.g., a voltmeter). The voltage measurement device 304 can be electrically coupled in parallel with the supercapacitor 120. For example, the voltage measurement device 304 can be electrically coupled across the supercapacitor 120. The voltage measurement device 304 can detect an amount of voltage output by the supercapacitor 120 and transmit an associated signal to the supercapacitor health measurement device 122.

In some examples, the system 300 can additionally include a temperature sensor 306. The temperature sensor 306 can detect the temperature of the supercapacitor 120, an environment in the wellbore near the supercapacitor 120, or both. The temperature sensor 306 can transmit a signal associated with the temperature of the supercapacitor 120, the temperature in the wellbore near the supercapacitor 120, or both to the supercapacitor health measurement device 122.

The supercapacitor health measurement device 122 can receive the signals from the current measurement device 302, the voltage measurement device 304, the temperature sensor 306, or any combination of these. The supercapacitor health measurement device 122 can determine one or more characteristics of the supercapacitor 120 based on the signals.

Although the components shown in FIG. 3 are depicted external to the supercapacitor health measurement device 122, in some examples, the supercapacitor health measurement device 122 may comprise the current measurement device 302, the voltage measurement device 304, the temperature sensor 306, the supercapacitor 120, or any combination of these.

Figure 4:
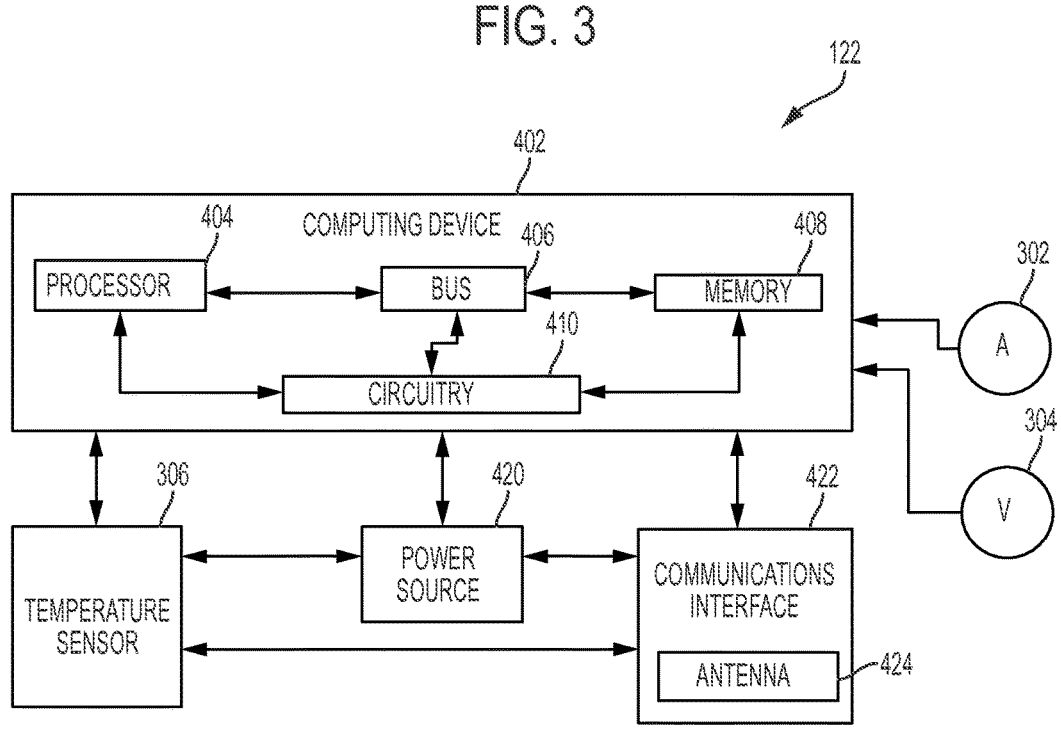
FIG. 4 is a block diagram of an example of a capacitor health measurement device for measuring supercapacitor degradation downhole according to some aspects.

FIG. 4 is a block diagram of an example of a supercapacitor health measurement device 122 for measuring supercapacitor degradation downhole according to some aspects.

In some examples, the components shown in FIG. 4 (e.g., the computing device 402, power source 420, the temperature sensor 306, and communications interface 422) can be integrated into a single structure. For example, the components can be within a single housing. In other examples, the components shown in FIG. 4 can be distributed (e.g., in separate housings) and in electrical communication with each other.

The supercapacitor health measurement device 122 can include a computing device 402. The computing device 402 can include a processor 404, a memory 408, and a bus 406. The processor 404 can execute one or more operations for supercapacitor health measurement device 122. The processor 404 can execute instructions stored in the memory 408 to perform the operations. The processor 404 can include one processing device or multiple processing devices. Non-limiting examples of the processor 404 include a Field-Programmable Gate Array ("FPGA"), an application-specific integrated circuit ("ASIC"), a microprocessor, etc.

The processor 404 can be communicatively coupled to the memory 408 via the bus 406. The non-volatile memory 408 may include any type of memory device that retains stored information when powered off. Non-limiting examples of the memory 408 include electrically erasable and programmable read-only memory ("EEPROM"), flash memory, or any other type of non-volatile memory. In some examples, at least some of the memory 408 can include a medium from which the processor 404 can read instructions. A computer-readable medium can include electronic, optical, magnetic, or other storage devices capable of providing the processor 404 with computer-readable instructions or other program code. Non-limiting examples of a computer-readable medium include (but are not limited to) magnetic disk(s), memory chip(s), ROM, random-access memory ("RAM"), an ASIC, a configured processor, optical storage, or any other medium from which a computer processor can read instructions. The instructions can include processor-specific instructions generated by a compiler or an interpreter from code written in any suitable computer-programming language, including, for example, C, C++, C#, etc.

The supercapacitor health measurement device 122 can include a power source 420. The power source 420 can be in electrical communication with the computing device 402, the communications interface 422, and the temperature sensor 306. In some examples, the power source 420 can include a battery (e.g. for powering the supercapacitor health measurement device 122). In other examples, the supercapacitor health measurement device 122 can be coupled to and powered by an electrical cable (e.g., a wireline). In still other examples, the power source 420 can include a supercapacitor for powering the supercapacitor health measurement device 122.

In some examples, the power source 420 can include an AC signal generator. The computing device 402 can operate the power source 420 to apply a transmission signal to the antenna 424. For example, the computing device 402 can cause the power source 420 to apply a voltage with a frequency within a specific frequency range to the antenna 424. This can cause the antenna 424 to generate a wireless transmission. In other examples, the computing device 402, rather than the power source 420, can apply the transmission signal to the antenna 424 for generating the wireless transmission.

The supercapacitor health measurement device 122 can include a communications interface 422. The communications interface 422 can include or can be coupled to an antenna 424. In some examples, part of the communications interface 422 can be implemented in software. For example, the communications interface 422 can include instructions stored in memory 408.

The communications interface 422 can receive signals from remote devices and transmit data to remote devices (e.g., the computing device 140 of FIG. 1). For example, the communications interface 422 can transmit wireless communications that are modulated by data via the antenna 424. In some examples, the communications interface 422 can receive signals (e.g., associated with data to be transmitted) from the processor 404 and amplify, filter, modulate, frequency shift, and otherwise manipulate the signals. In some examples, the communications interface 422 can transmit the manipulated signals to the antenna 424. The antenna 424 can receive the manipulated signals and responsively generate wireless communications that carry the data.

In some examples, the communications interface 422 can transmit data via a wired interface. For example, the communications interface 422 can transmit data via a wireline. As another example, the communications interface 422 can generate an optical waveform. The communications interface 422 can generate the optical waveform by pulsing a light emitting diode at a particular frequency. The communications interface 422 can transmit the optical waveform via an optical cable (e.g., a fiber optic cable).

In some examples, the supercapacitor health measurement device 122 can include a current measurement device 302, a voltage measurement device 304, or both. The current measurement device 302 can detect an amount of current output by a supercapacitor and transmit an associated sensor signal to the computing device 402. The voltage measurement device 304 can detect an amount of current output by a supercapacitor and transmit an associated sensor signal to the computing device 402. In some examples, the supercapacitor health measurement device 122 can include a temperature sensor 306. The temperature sensor 306 can detect a temperature of a supercapacitor and/or an environment in a wellbore near the supercapacitor and transmit an associated signal to the computing device 402.

In some examples, the supercapacitor health measurement device 122 can additionally or alternatively include circuitry 410. The circuitry 410 can include, can be in electrical communication with, or can replace any number of the components shown in FIG. 4. The circuitry 410 can include one or more integrated circuits, timers, comparators, amplifiers, filters, digital-to-analog converters, analog-to-digital converters, resistors, transistors, capacitors, microcontrollers or processors, electrodes, switches, inductors, or any combination of these. In one example, the circuitry 410 can replace the processor 404, bus 406, and/or memory 408 and include one or more integrated circuits configured to receive signals from the current measurement device 302, voltage measurement device 304, or both and execute an algorithm.

Figure 5:
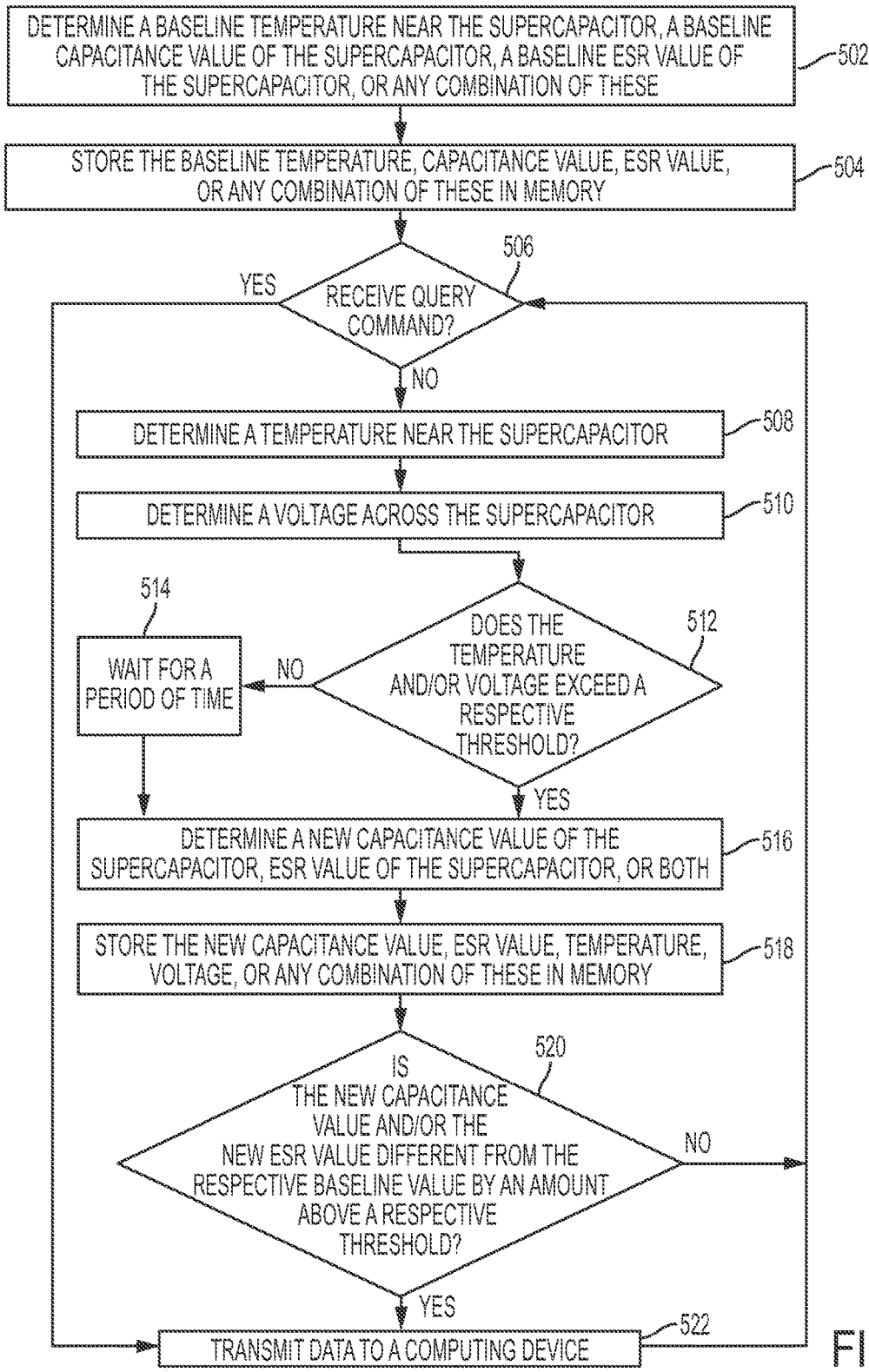
FIG. 5 is an example of a flow chart of a process for measuring supercapacitor degradation downhole according to some aspects.

FIG. 5 is an example of a flow chart of a process for measuring supercapacitor degradation downhole according to some aspects.

In block 502, the supercapacitor health measurement device 122 determines a baseline temperature near the supercapacitor, capacitance value of the supercapacitor, a baseline ESR value of the supercapacitor, or any combination of these. In some examples, a user can input the baseline temperature near the supercapacitor, the baseline capacitance value of the supercapacitor, the baseline ESR value of the supercapacitor, or any combination of these into the supercapacitor health measurement device 122. For example, prior to positioning the supercapacitor health measurement device 122 in a wellbore, a user can input a capacitance value, ESR value, or both from a specification or manual associated with the supercapacitor. In one such example, the specification or manual can contain one or more graphs in which capacitance values, ESR values, or both are mapped to particular temperatures. The user can use the graphs to determine the baseline capacitance value and/or the baseline ESR value based on a temperature in the wellbore. The user can then input the baseline capacitance value, baseline ESR value, or both into the supercapacitor health measurement device 122. The supercapacitor health measurement device 122 can receive the user input and store the user input in memory (e.g., memory 408 of FIG. 4).

In other examples, a user can cause a computing device (e.g., computing device 140 of FIG. 1) to transmit the baseline capacitance value, ESR value, or both to the supercapacitor health measurement device 122 after the supercapacitor health measurement device 122 is positioned in the wellbore. For example, the user can cause the computing device to transmit the baseline capacitance value, ESR value, or both via a wired or wireless interface to the supercapacitor health measurement device 122. The supercapacitor health measurement device 122 can receive the transmission and store the baseline capacitance value, ESR value, or both in memory.

In other examples, the supercapacitor health measurement device 122 can determine the baseline capacitance value, ESR value, or both subsequent to the supercapacitor being positioned in the wellbore. For example, the supercapacitor health measurement device 122 can use the algorithm C=(I*dt)/(dV) to determine the capacitance (C), where I is the current output by the supercapacitor over a time period dt, and dV is a change in voltage over the time period dt. In one such example, the supercapacitor health measurement device 122 can perform the process of FIG. 6 to determine the baseline capacitance value. In some examples, the supercapacitor health measurement device 122 can use the algorithm ESR=dv/di to determine the ESR value, where dv is a change in voltage over a period of time, and di is a change in current over the period of time. In one such example, the supercapacitor health measurement device 122 can perform the process of FIG. 8 to determine the baseline ESR value.

In some examples, the supercapacitor health measurement device 122 can determine the baseline capacitance value, ESR value, or both based on a graph or correlation of data stored in memory. For example, the supercapacitor health measurement device 122 can include one or more graphs and/or lookup tables in which capacitance values, ESR values, or both are mapped to particular temperatures. Subsequent to the supercapacitor being positioned in the wellbore, the supercapacitor health measurement device 122 can determine a baseline temperature near the supercapacitor health measurement device 122. For example, the supercapacitor health measurement device 122 can use a temperature sensor (e.g., temperature sensor 306 of FIG. 4) to detect the baseline temperature near the supercapacitor. The supercapacitor health measurement device 122 can use the graph or lookup table to determine the baseline capacitance value, ESR value, or both based on the baseline temperature.

In some examples, the supercapacitor health measurement device 122 can determine the baseline capacitance value, ESR value, or both within a close period of time to the supercapacitor being positioned in the wellbore. This can allow the supercapacitor health measurement device 122 to determine the baseline capacitance value, ESR value, or both before one or both of the values meaningfully change from their default amounts as manufactured.

In block 504, the supercapacitor health measurement device 122 stores the baseline temperature, capacitance value, ESR value, or any combination of these in memory. For example, the supercapacitor health measurement device 122 can store the baseline temperature, baseline capacitance value, and the baseline ESR value in the memory 408 of FIG. 1.

In block 506, the supercapacitor health measurement device 122 determines if the supercapacitor health measurement device 122 received a query command (e.g., transmitted from a remote computing device or input by a user). For example, a user at the well surface can cause a computing device, such as computing device 140 of FIG. 1, to transmit a query command to the supercapacitor health measurement device 122 via a wired or wireless interface. As another example, a user can retrieve the supercapacitor health measurement device 122 from the wellbore and input a query command into the supercapacitor health measurement device 122. If the supercapacitor health measurement device 122 does not receive the query command, the supercapacitor health measurement device 122 process continues to block 508. If the supercapacitor health measurement device 122 does receive the query command, the process continues to block 522.

In block 508, the supercapacitor health measurement device 122 determines a temperature near the supercapacitor. For example, the supercapacitor health measurement device 122 can use a temperature sensor (e.g., temperature sensor 306 of FIG. 4) to detect a temperature of the supercapacitor or a temperature near the supercapacitor. The temperature sensor can transmit an associated temperature signal to the supercapacitor health measurement device 122 (e.g., the processor 404 of FIG. 4). Based on the temperature signal, the supercapacitor health measurement device 122 can determine the temperature near the supercapacitor.

In block 510, the supercapacitor health measurement device 122 determines a voltage across the supercapacitor. For example, the supercapacitor health measurement device 122 can use a voltage measurement device (e.g., voltage measurement device 304 of FIG. 4) to detect a voltage across the supercapacitor. The voltage measurement device can transmit an associated signal to the supercapacitor health measurement device 122 (e.g., the processor 404 of FIG. 4). Based on the signal, the supercapacitor health measurement device 122 can determine the voltage across the supercapacitor.

In block 512, the supercapacitor health measurement device 122 determines if the temperature and/or the voltage exceeds a respective threshold. For example, the supercapacitor health measurement device 122 can determine if the voltage exceeds a first threshold. In some examples, the first threshold can be a voltage rating provided by the manufacturer (e.g., a maximum voltage rating provided in a manual or specification for the supercapacitor). The supercapacitor health measurement device 122 can additionally or alternatively determine if the temperature exceeds a second threshold. In some examples, the second threshold can be a temperature rating provided by the manufacturer (e.g., a maximum temperature rating provided in a manual or specification for the supercapacitor). The first threshold can be the same as or can be different from the second threshold.

In some examples, if the supercapacitor health measurement device 122 determines that the temperature and/or the voltage exceeds a respective threshold, the process can continue to block 516. If the supercapacitor health measurement device 122 determines that the temperature and/or the voltage does not exceed the respective threshold, the process can continue to block 514. With this configuration, the supercapacitor health measurement device 122 can determine characteristics of the supercapacitor periodically or in response to the temperature, voltage, or both exceeding respective thresholds, which may degrade or damage the supercapacitor.

In block 514, the supercapacitor health measurement device 122 waits for a period of time. The period of time can be pseudorandom or can be input by a user. For example, the user can preprogram the period of time into memory before the capacitor health measurement device is positioned in the wellbore. As another example, a user can cause a computing device to transmit the period of time, via a wired or wireless interface, to the supercapacitor health measurement device 122 subsequent to the supercapacitor health measurement device 122 being positioned in the wellbore. The period of time can include any suitable interval of time. For example, the period of time can include one minute, one hour, six hours, one day, one week, or one month.

In block 516, the supercapacitor health measurement device 122 determines a new capacitance value of the supercapacitor, a new ESR value of the supercapacitor, or both. For example, the supercapacitor health measurement device 122 can perform the process of FIG. 6 to determine the new capacitance value. The supercapacitor health measurement device 122 can perform the process of FIG. 8 to determine the new ESR value.

In block 518, the supercapacitor health measurement device 122 stores the new capacitance value, new ESR value, the temperature, the voltage, or any combination of these in memory. For example, the supercapacitor health measurement device 122 can store the new capacitance value, new ESR value, the temperature, and the voltage in the memory 408 of FIG. 1.

In block 520, the supercapacitor health measurement device 122 determines if the new capacitance value and/or the new ESR value is different from the respective baseline value by an amount above a respective threshold. For example, the supercapacitor health measurement device 122 can determine if the new capacitance value is different from the baseline capacitance value by a first amount above a first threshold. The supercapacitor health measurement device 122 can determine if the new ESR value is different from the baseline ESR value by a second amount above a second threshold. In some examples, the first threshold, the second threshold, or both can be 20 percent. The first threshold can be the same or different from the second threshold.

In some examples, if the new capacitance value and/or the new ESR value is not different from the respective baseline value by the amount above the respective threshold, the process returns to block 506. In some examples, if the new capacitance value and/or the new ESR value is different from the respective baseline value by the amount above the respective threshold, the process continues to block 522.

In block 522, the supercapacitor health measurement device 122 transmits data to a computing device (e.g., computing device 140 of FIG. 1). The supercapacitor health measurement device 122 can transmit the data via a wired or wireless interface. In some examples, the data can include a notification or warning indication that the supercapacitor has failed or is approaching failure. In other examples, the data can include a capacitance value, an ESR value, a temperature, a voltage, or any combination of these. For example, the data can include the new capacitance value, the new ESR value, or both. As another example, the data can include two or more of the capacitance values, ESR values, temperatures, and voltages stored in memory. In some examples, the process then returns to block 506.

In some examples, the computing device (and/or the well operator) can receive the data and perform one or more tasks based on the data. For example, the computing device can analyze the temperature, ESR, and capacitance values over time to determine whether the supercapacitor has failed or is approaching failure. As another example, the computing device can apply the temperature values to a mean-time-between-failure (MTBF) curve (e.g., provided by the manufacturer of the supercapacitor) to determine, for example, a likely time period after which the supercapacitor may fail.

In some examples, the computing device can analyze data associated with other supercapacitors to predict if and when the supercapacitor will fail. For example, the computing device can analyze temperature data, ESR values, and/or capacitance values associated with other supercapacitors that have failed to detect trends. For instance, the computing device can apply one or more statistical techniques to temperature data, ESR values, and/or capacitance values associated with other supercapacitors to determine key parameters indicative of a failing supercapacitor. The computing device can determine if the supercapacitor will fail and/or when the supercapacitor will fail based on the trends and parameters. In this manner, the computing device can "learn" over time.

In some examples, the computing device can schedule maintenance or other well operations based on the data. For example, the computing device can determine that the supercapacitor will likely fail within a particular time period and schedule maintenance to preempt such a failure. This can minimize costs and downtime for the well system.

In some examples, the computing device can determine why the supercapacitor failed based on the data. For example, the computing device can analyze temperature data associated with the failure of the supercapacitor to determine if the temperature caused the supercapacitor failure.

Figure 6:
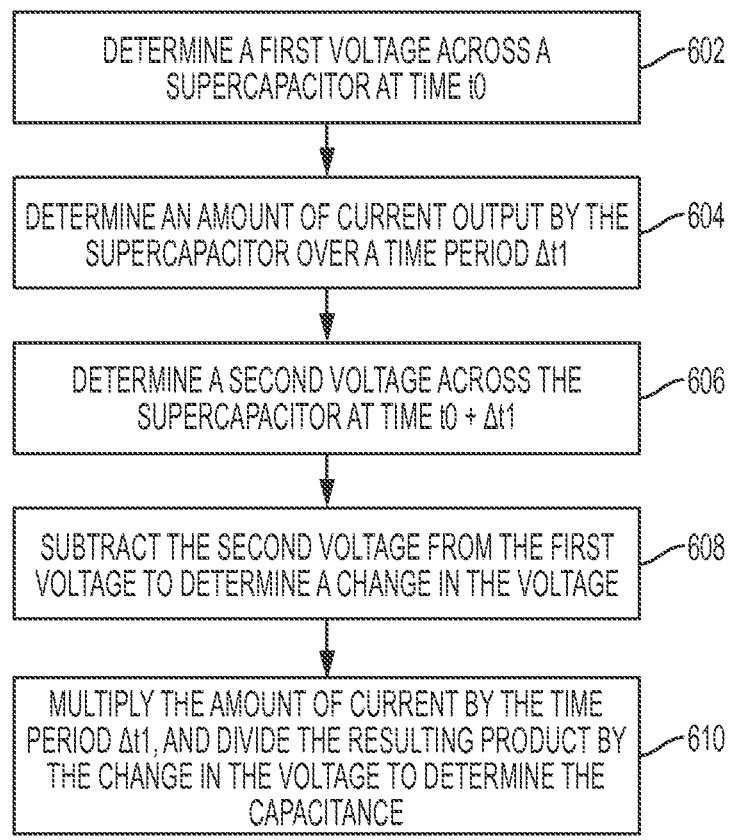
FIG. 6 is an example of a flow chart of a process for determining a capacitance of a capacitor for measuring supercapacitor degradation downhole according to some aspects.

FIG. 6 is an example of a flow chart of a process for determining a capacitance of a capacitor for measuring supercapacitor degradation downhole according to some aspects.

In block 602, the supercapacitor health measurement device 122 determines a first voltage across the supercapacitor at time t0. For example, the supercapacitor health measurement device 122 can cause the voltage measurement device 304 of FIG. 4 to determine a voltage across the supercapacitor at time t0. The voltage measurement device 304 can determine the voltage and transmit an associated signal to the supercapacitor health measurement device 122. The supercapacitor health measurement device 122 can receive the signal, determine the first voltage based on the signal, and store the first voltage in memory.

Figure 7:
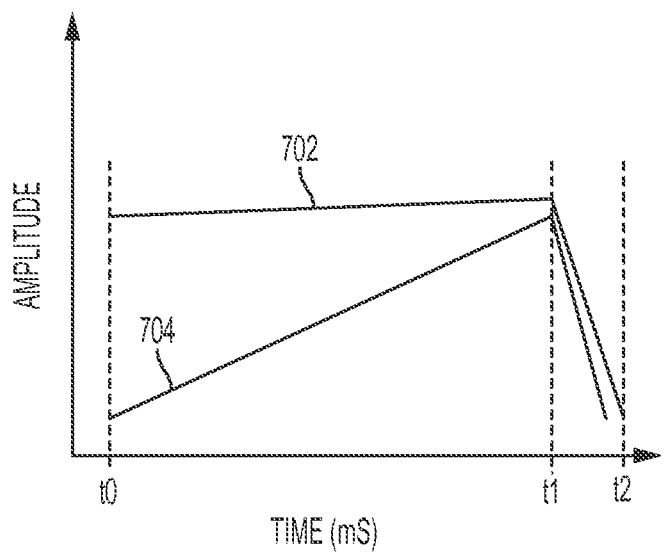
FIG. 7 is a graph depicting an example of a current through a capacitor versus a voltage across the capacitor over a period of time for measuring supercapacitor degradation downhole according to some aspects.

In block 604, the supercapacitor health measurement device 122 determines an amount of current output by the supercapacitor over a time period $\Delta t1$, which can be the time period between times t0 and t1, for example as shown in FIG. 7. In some examples, the time period can be short enough for the amplitude of the current output by the supercapacitor remains substantially constant (e.g., does not change by more than one 500 milliamps). For example, referring to FIG. 7, between times t0 and t1, the current 702 output by the supercapacitor stays substantially constant (and the voltage 704 increases).

In some examples, the supercapacitor health measurement device 122 can cause the current measurement device 302 of FIG. 4 to determine the amount of current output by the supercapacitor over time period $\Delta t1$. The current measurement device 302 can determine the amount of current and transmit an associated signal to the supercapacitor health measurement device 122. The supercapacitor health measurement device 122 can receive the signal, determine the amount of current over time period $\Delta t1$ based on the signal, and store the amount of current in memory.

In block 606, the supercapacitor health measurement device 122 determines a second voltage across the supercapacitor at time $t0+\Delta t1$. For example, the supercapacitor health measurement device 122 can cause the voltage measurement device 304 of FIG. 4 to determine another voltage across the supercapacitor at time $t0+\Delta t1$. The voltage measurement device 304 can determine the voltage and transmit an associated signal to the supercapacitor health measurement device 122. The supercapacitor health measurement device 122 can receive the signal, determine the second voltage based on the signal, and store the second voltage in memory.

In block 608, the supercapacitor health measurement device 122 subtracts the second voltage from the first voltage to determine a change in the voltage.

In block 610, the supercapacitor health measurement device 122 multiplies the amount of current with $\Delta t1$ and then divides the resulting product by the change in the voltage to determine the capacitance.

Figure 8:
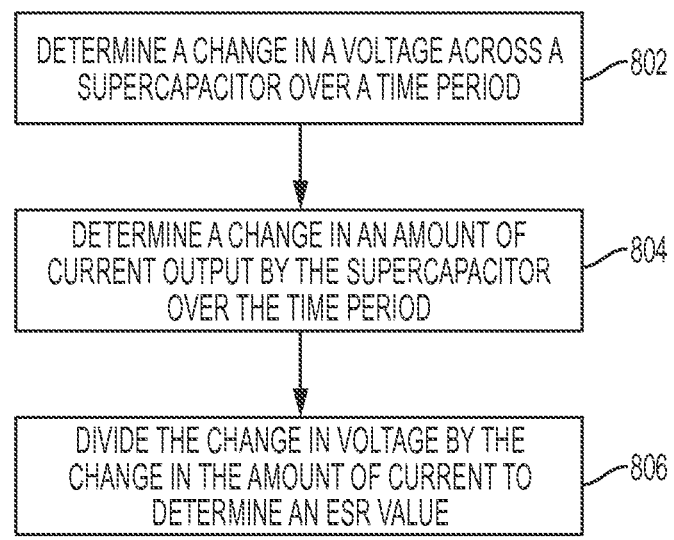
FIG. 8 is an example of a flow chart of a process for determining an equivalent series resistance of a capacitor for measuring supercapacitor degradation downhole according to some aspects.

FIG. 8 is an example of a flow chart of a process for determining an equivalent series resistance of a capacitor for measuring supercapacitor degradation downhole according to some aspects.

In block 802, the supercapacitor health measurement device 122 determines a change in a voltage across a supercapacitor over a period of time ($\Delta t2$, which can be the time period between t2 and t1, for example as shown in FIG. 7). In some examples, the period of time can be long enough for the amplitude of the current output by the supercapacitor to change by an amount above a threshold (e.g., can change by a few amperes). For example, referring to FIG. 7, between times t1 and t2, the current 702 (and the voltage 704) rapidly change in amplitude.

In some examples, the supercapacitor health measurement device 122 can cause the voltage measurement device 304 of FIG. 4 to determine a first voltage across the supercapacitor at time t1. Thereafter, the supercapacitor health measurement device 122 can cause the voltage measurement device 304 to determine a second voltage across the supercapacitor at time $t1+\Delta t2$. The supercapacitor health measurement device 122 can subtract the second voltage from the first voltage to determine the change in the voltage across the supercapacitor over the period of time.

In block 804, the supercapacitor health measurement device 122 determines a change in an amount of current output by the supercapacitor over the period of time. For example, the supercapacitor health measurement device 122 can cause the current measurement device 302 of FIG. 4 to determine a first amount of current output by the supercapacitor at time t1. Thereafter, the supercapacitor health measurement device 122 amount of current output by the supercapacitor at time $t1+\Delta t2$. The supercapacitor health measurement device 122 can subtract the second amount of current from the first amount of current to determine the change in the amount of current output by the supercapacitor over the period of time.

In block 806, the supercapacitor health measurement device 122 divides the change in the voltage over the time period by the change in the amount of current over the time period to determine an ESR value.

In some aspects, systems and methods for measuring supercapacitor degradation downhole are provided according to one or more of the following examples:

Example #1

A system for use in a wellbore can include a supercapacitor health measurement device. The supercapacitor health measurement device can include circuitry for determining a capacitance of a supercapacitor that is positionable in the wellbore and an equivalent series resistance (ESR) value of the supercapacitor, and for transmitting the capacitance and the ESR value. The system can also include a remote device that is positionable aboveground. The remote device can include circuitry for receiving the capacitance and ESR value.

Example #2

The system of Example #1 may feature the supercapacitor health measurement device including a processing device and a memory device. The memory device can store instructions executable by the processing device for causing the processing device to: receive a baseline capacitance value; receive a baseline ESR value; and store the baseline capacitance value and the baseline ESR value in the memory device.

Example #3

The system of Example #2 may feature the supercapacitor health measurement device including a temperature sensor. The temperature sensor can include circuitry configured for detecting a temperature of the supercapacitor and transmitting a temperature sensor signal associated with the temperature to the processing device. The supercapacitor health measurement device can also include a voltage measurement device. The voltage measurement device can include circuitry configured for determining a voltage across the supercapacitor and transmitting a signal associated with the voltage to the processing device. The memory device can further include instructions executable by the processing device for causing the processing device to receive the temperature sensor signal; determine the temperature based on the temperature sensor signal; and determine whether the temperature exceeds a first threshold. The instructions can further be executable by the processing device for causing the processing device to receive the signal associated with the voltage; determine the voltage across the supercapacitor based on the signal; and determine whether the voltage across the supercapacitor exceeds a second threshold.

Example #4

The system of Example #3 may feature the memory device further including instructions executable by the processing device for causing the processing device to: wait for a predetermined period of time in response to both (i) the temperature being below the first threshold, and (ii) the voltage across the supercapacitor being below the second threshold.

Example #5

The system of Example #4 may feature the memory device including instructions executable by the processing device for causing the processing device to: determine a new capacitance value of the supercapacitor and a new ESR value of the supercapacitor in response to (i) an expiration of the predetermined period of time, or (ii) the temperature exceeding the first threshold or the voltage across the supercapacitor exceeding the second threshold. The memory device may further include instructions executable by the processing device for causing the processing device to store the new capacitance value and the new ESR value in the memory device.

Example #6

The system of Example #5 may feature a current measurement device including circuitry configured for determining an amount of current that is output by the supercapacitor and transmitting an associated current signal to the processing device. The memory device may include instructions executable by the processing device for causing the processing device to: receive a first voltage across the supercapacitor at a first time from the voltage measurement device; receive a second voltage across the supercapacitor at a second time from the voltage measurement device; and receive, from the current measurement device, the amount of current that is output by the supercapacitor over a period of time between the first time and the second time. The memory device may further include instructions executable by the processing device for causing the processing device to: subtract the second voltage from the first voltage to determine a change in the voltage over the period of time; and determine the new capacitance value by multiplying the amount of current by the period of time and dividing a resulting product by the change in the voltage.

Example #7

The system of any of Examples #5-6 may feature a current measurement device including circuitry configured for determining an amount of current output by the supercapacitor and transmitting an associated current signal to the processing device. The memory device may include instructions executable by the processing device for causing the processing device to: receive a first voltage across the supercapacitor at a first time from the voltage measurement device; receive a first amount of current that is output by the supercapacitor at the first time from the current measurement device; receive a second voltage across the supercapacitor at a second time from the voltage measurement device; and receive a second amount of current that is output by the supercapacitor at the second time from the current measurement device. The memory device may include instructions executable by the processing device for causing the processing device to: subtract the second voltage from the first voltage to determine a voltage change over a period of time between the first time and the second time; subtract the second amount of current from the first amount of current to determine a current change over the period of time between the first time and the second time; and divide the voltage change by the current change to determine the new ESR value.

Example #8

The system of any of Examples #5-7 may feature the memory device including instructions executable by the processing device for causing the processing device to determine if the new capacitance value is different from the baseline capacitance value by an amount above a third threshold; and determine if the new ESR value is different from the baseline ESR value by another amount above a fourth threshold. The memory device may further include instructions executable by the processing device for causing the processing device to transmit data to the remote device in response to the new capacitance value being different from the baseline capacitance value by the amount above the third threshold, the new ESR value being different from the baseline ESR value by the other amount above the fourth threshold, or both. The data can include the new capacitance value and the new ESR value.

Example #9

The system of any of Examples #1-8 may feature the remote device including a display. The remote device can be configured for outputting the capacitance and the ESR value via the display.

Example #10

The system of any of Examples #1-9 may feature the supercapacitor health measurement device being positionable in a well tool for use in the wellbore.

Example #11

A supercapacitor health measurement device for use with a supercapacitor that is positionable in a wellbore can include a processing device and a memory device. The memory device can store instructions executable by the processing device. The supercapacitor health measurement device can also include a temperature sensor including circuitry configured for detecting a temperature of the supercapacitor and transmitting a temperature sensor signal associated with the temperature to the processing device. The supercapacitor health measurement device can further include a current measurement device including circuitry configured for determining an amount of current that is output by the supercapacitor and transmitting an associated current signal to the processing device. Additionally, the supercapacitor health measurement device can include a voltage measurement device including circuitry configured for determining a voltage across the supercapacitor and transmitting a signal associated with the voltage to the processing device.

Example #12

The supercapacitor health measurement device of Example #11 may feature the memory device including instructions executable by the processing device for causing the processing device to: receive the temperature sensor signal; determine the temperature based on the temperature sensor signal; and determine whether the temperature exceeds a first threshold. The memory device may also include instructions executable by the processing device for causing the processing device to: receive the signal associated with the voltage; determine the voltage across the supercapacitor based on the signal; and determine whether the voltage across the supercapacitor exceeds a second threshold.

Example #13

The supercapacitor health measurement device of Example #12 may feature the memory device including instructions executable by the processing device for causing the processing device to: wait for a predetermined period of time in response to both (i) the temperature being below the first threshold, and (ii) the voltage across the supercapacitor being below the second threshold. The memory device may also include instructions executable by the processing device for causing the processing device to determine a new capacitance value of the supercapacitor and a new ESR value of the supercapacitor in response to (i) an expiration of the predetermined period of time, or (ii) the temperature exceeding the first threshold or the voltage across the supercapacitor exceeding the second threshold. The memory device may further include instructions executable by the processing device for causing the processing device to store the new capacitance value and the new ESR value in the memory device.

Example #14

The supercapacitor health measurement device of Example #13 may feature the memory device including instructions executable by the processing device for causing the processing device to: receive a first voltage across the supercapacitor at a first time from the voltage measurement device; receive a second voltage across the supercapacitor at a second time from the voltage measurement device; receive, from the current measurement device, the amount of current that is output by the supercapacitor over a period of time between the first time and the second time; subtract the second voltage from the first voltage to determine a change in the voltage over the period of time; and determine the new capacitance value by multiplying the amount of current by the period of time and dividing a resulting product by the change in the voltage.

Example #15

The supercapacitor health measurement device of any of Examples #13-14 may feature the memory device including instructions executable by the processing device for causing the processing device to: receive a first voltage across the supercapacitor at a first time from the voltage measurement device; receive a first amount of current that is output by the supercapacitor at the first time from the current measurement device; receive a second voltage across the supercapacitor at a second time from the voltage measurement device; receive a second amount of current that is output by the supercapacitor at the second time from the current measurement device; subtract the second voltage from the first voltage to determine a voltage change over a period of time between the first time and the second time; subtract the second amount of current from the first amount of current to determine a current change over the period of time between the first time and the second time; and divide the voltage change by the current change to determine the new ESR value.

Example #16

The supercapacitor health measurement device of any of Examples #13-15 may feature the memory device including instructions executable by the processing device for causing the processing device to: determine if the new capacitance value is different from a baseline capacitance value by an amount above a third threshold; and determine if the new ESR value is different from a baseline ESR value by another amount above a fourth threshold. The memory device may also include instructions executable by the processing device for causing the processing device to transmit data to a remote device in response to the new capacitance value being different from the baseline capacitance value by the amount above the third threshold, the new ESR value being different from the baseline ESR value by the other amount above the fourth threshold, or both. The data can include the new capacitance value and the new ESR value.

Example #17

The supercapacitor health measurement device of Example #16 may feature the data including the voltage across the supercapacitor and the temperature.

Example #18

The supercapacitor health measurement device of any of Examples #11-17 may feature the supercapacitor health measurement device being positionable in a well tool for use in the wellbore.

Example #19

A well tool for use in a wellbore can include a supercapacitor for transmitting power to an electronic device of the well tool. The well tool can also include a supercapacitor health measurement device. The supercapacitor health measurement device can include circuitry electrically coupled to the supercapacitor for determining a capacitance and an equivalent series resistance (ESR) value of the supercapacitor. The supercapacitor health measurement device can also include circuitry for transmitting the capacitance and the ESR value to a remote device.

Example #20

The well tool of Example #19 may feature the supercapacitor health measurement device including a processing device and a memory device in which instructions executable by the processing device are stored. The supercapacitor health measurement device may also include a temperature sensor including circuitry configured for detecting a temperature of the supercapacitor and transmitting a temperature sensor signal associated with the temperature to the processing device. The supercapacitor health measurement device may also include a current measurement device including circuitry configured for determining an amount of current that is output by the supercapacitor and transmitting an associated current signal to the processing device. Further, the supercapacitor health measurement device may include a voltage measurement device including circuitry configured for determining a voltage across the supercapacitor and transmitting a signal associated with the voltage to the processing device.

Example #21

A method can include receiving, by a supercapacitor health measurement device positioned in a wellbore, a temperature sensor signal indicating a temperature of a supercapacitor from a temperature sensing device. The method can also include determining the temperature based on the temperature sensor signal. The method can also include determining whether the temperature exceeds a first threshold. The method can also include receiving a signal indicating a voltage across the supercapacitor from a voltage measurement device. The method can also include determining the voltage across the supercapacitor based on the signal. The method can also include determining whether the voltage across the supercapacitor exceeds a second threshold.

Example #22

The method of Example #21 may feature receiving a baseline capacitance value; receiving a baseline ESR value; storing the baseline capacitance value and the baseline ESR value in a memory device; or any combination of these.

Example #23

The method of Examples #21-22 may feature waiting for a predetermined period of time in response to both (i) the temperature being below the first threshold, and (ii) the voltage across the supercapacitor being below the second threshold.

Example #24

The method of any of Examples #21-23 may feature determining a new capacitance value of the supercapacitor and a new ESR value of the supercapacitor in response to (i) an expiration of a predetermined period of time, and/or (ii) the temperature exceeding the first threshold or the voltage across the supercapacitor exceeding the second threshold. The method may feature storing the new capacitance value and the new ESR value in the memory device.

Example #25

The method of Example #24 may feature receiving a first voltage across the supercapacitor at a first time from the voltage measurement device. The method may feature receiving a second voltage across the supercapacitor at a second time from the voltage measurement device. The method may feature receiving an amount of current that is output by the supercapacitor over a period of time between the first time and the second time from a current measurement device. The method may feature subtracting the second voltage from the first voltage to determine a change in the voltage over the period of time. The method may feature determining the new capacitance value by multiplying the amount of current by the period of time and dividing a resulting product by the change in the voltage.

Example #26

The method of any of Examples #24-25 may feature receiving a first voltage across the supercapacitor at a first time from the voltage measurement device. The method may also feature receiving a first amount of current that is output by the supercapacitor at the first time from a current measurement device. The method may also feature receiving a second voltage across the supercapacitor at a second time from the voltage measurement device. The method may also feature receiving a second amount of current that is output by the supercapacitor at the second time from the current measurement device. The method may also feature subtracting the second voltage from the first voltage to determine a voltage change over a period of time between the first time and the second time. The method may also feature subtracting the second amount of current from the first amount of current to determine a current change over the period of time between the first time and the second time. The method may also feature dividing the voltage change by the current change to determine the new ESR value.

Example #27

The method of any of Examples #24-26 may feature determining if the new capacitance value is different from the baseline capacitance value by an amount above a third threshold. The method may also feature determining if the new ESR value is different from the baseline ESR value by another amount above a fourth threshold. The method may also feature transmitting data to a remote device in response to the new capacitance value being different from the baseline capacitance value by the amount above the third threshold, the new ESR value being different from the baseline ESR value by the other amount above the fourth threshold, or both. The data can include the new capacitance value and the new ESR value.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system for use in a wellbore, the system comprising:
a supercapacitor health measurement device comprising circuitry configured to:
  determine a capacitance of a supercapacitor that is positionable in the wellbore;
  determine an equivalent series resistance (ESR) value of the supercapacitor by dividing (i) a change in voltage across the supercapacitor over a time period by (ii) a change in current output by the supercapacitor over the time period; and
  transmit the capacitance and the ESR value; and
a remote device that is positionable aboveground comprising circuitry for receiving the capacitance and ESR value.

2. The system of claim 1, wherein the supercapacitor health measurement device comprises:
a processing device; and
a memory device in which instructions executable by the processing device are stored for causing the processing device to:
  receive a baseline capacitance value;
  receive a baseline ESR value; and
  store the baseline capacitance value and the baseline ESR value in the memory device.

3. The system of claim 2, wherein the supercapacitor health measurement device further comprises:
a temperature sensor comprising circuitry configured for detecting a temperature of the supercapacitor and transmitting a temperature sensor signal associated with the temperature to the processing device; and
a voltage measurement device comprising circuitry configured for determining the voltage across the supercapacitor and transmitting a signal associated with the voltage to the processing device,
wherein the memory device further comprises instructions executable by the processing device for causing the processing device to:
  receive the temperature sensor signal;
  determine the temperature based on the temperature sensor signal;
  determine whether the temperature exceeds a first threshold;
  receive the signal associated with the voltage;
  determine the voltage across the supercapacitor based on the signal; and
  determine whether the voltage across the supercapacitor exceeds a second threshold.

4. The system of claim 3, wherein the memory device further comprises instructions executable by the processing device for causing the processing device to:
  wait for a predetermined period of time in response to both (i) the temperature being below the first threshold, and (ii) the voltage across the supercapacitor being below the second threshold.

5. The system of claim 4, wherein the memory device further comprises instructions executable by the processing device for causing the processing device to:
  determine a new capacitance value of the supercapacitor and a new ESR value of the supercapacitor in response to (i) an expiration of the predetermined period of time, or (ii) the temperature exceeding the first threshold or the voltage across the supercapacitor exceeding the second threshold; and
  store the new capacitance value and the new ESR value in the memory device.

6. The system of claim 5, further comprising a current measurement device including circuitry configured for determining an amount of current that is output by the supercapacitor and transmitting an associated current signal to the processing device, wherein the memory device further comprises instructions executable by the processing device for causing the processing device to:
  receive a first voltage across the supercapacitor at a first time from the voltage measurement device;
  receive a second voltage across the supercapacitor at a second time from the voltage measurement device;
  receive, from the current measurement device, the amount of current that is output by the supercapacitor over a period of time between the first time and the second time;
  subtract the second voltage from the first voltage to determine a change in the voltage over the period of time; and
  determine the new capacitance value by multiplying the amount of current by the period of time and dividing a resulting product by the change in the voltage.

7. The system of claim 5, further comprising a current measurement device including circuitry configured for determining an amount of current output by the supercapacitor and transmitting an associated current signal to the processing device, wherein the memory device further comprises instructions executable by the processing device for causing the processing device to:
  receive a first voltage across the supercapacitor at a first time from the voltage measurement device;
  receive a first amount of current that is output by the supercapacitor at the first time from the current measurement device;
  receive a second voltage across the supercapacitor at a second time from the voltage measurement device;
  receive a second amount of current that is output by the supercapacitor at the second time from the current measurement device;
  subtract the second voltage from the first voltage to determine a voltage change over a period of time between the first time and the second time;

subtract the second amount of current from the first amount of current to determine a current change over the period of time between the first time and the second time; and divide the voltage change by the current change to determine the new ESR value.

8. The system of claim 5, wherein the memory device further comprises instructions executable by the processing device for causing the processing device to:

determine if the new capacitance value is different from the baseline capacitance value by an amount above a third threshold;

determine if the new ESR value is different from the baseline ESR value by another amount above a fourth threshold; and transmit data to the remote device in response to at least one of (i) the new capacitance value being different from the baseline capacitance value by the amount above the third threshold, or (ii) the new ESR value being different from the baseline ESR value by the other amount above the fourth threshold, wherein the data comprises the new capacitance value and the new ESR value.

9. The system of claim 8, wherein the remote device comprises a display, and wherein the remote device is configured for outputting the capacitance and the ESR value via the display.

10. The system of claim 1, wherein the supercapacitor health measurement device is positioned on a well tool for use in the wellbore.

11. A supercapacitor health measurement system for use with a supercapacitor that is positionable in a wellbore, the supercapacitor health measurement system comprising:

a processing device;

a current measurement device communicatively coupled to the processing device, the current measurement device comprising circuitry configured for determining an amount of current that is output by the supercapacitor;

a voltage measurement device communicatively coupled to the processing device, the voltage measurement device comprising circuitry configured for determining a voltage across the supercapacitor; and a memory device including instructions executable by the processing device for causing the processing device to:

receive a first plurality of sensor signals from the current measurement device, the first plurality of sensor signals indicating a change in current output by the supercapacitor over a time period;

receive a second plurality of sensor signals from the voltage measurement device, the second plurality of sensor signals indicating a change in voltage across the supercapacitor over the time period; and determine an equivalent series resistance (ESR) value of the supercapacitor by dividing (i) the change in voltage across the supercapacitor over the time period by (ii) the change in current over the time period.

12. The supercapacitor health measurement system of claim 11, wherein the memory device further comprises instructions executable by the processing device for causing the processing device to:

receive a temperature sensor signal from a temperature sensor, the temperature sensor signal indicating a temperature of the supercapacitor;

determine the temperature based on the temperature sensor signal;

determine whether the temperature exceeds a first threshold;

receive a signal associated with the voltage across the supercapacitor from the voltage measurement device;

determine the voltage across the supercapacitor based on the signal; and determine whether the voltage across the supercapacitor exceeds a second threshold.

13. The supercapacitor health measurement system of claim 12, wherein the memory device further comprises instructions executable by the processing device for causing the processing device to:

wait for a predetermined period of time in response to both (i) the temperature being below the first threshold, and (ii) the voltage across the supercapacitor being below the second threshold;

determine a capacitance value of the supercapacitor and the ESR value of the supercapacitor in response to (i) an expiration of the predetermined period of time, or (ii) the temperature exceeding the first threshold or the voltage across the supercapacitor exceeding the second threshold; and store the capacitance value and the ESR value in the memory device.

14. The supercapacitor health measurement system of claim 11, wherein the memory device further comprises instructions executable by the processing device for causing the processing device to:

receive a first voltage across the supercapacitor at a first time from the voltage measurement device;

receive a second voltage across the supercapacitor at a second time from the voltage measurement device;

receive, from the current measurement device, the amount of current that is output by the supercapacitor over a period of time between the first time and the second time;

subtract the second voltage from the first voltage to determine a voltage change over the period of time; and determine a capacitance value for the supercapacitor by multiplying the amount of current by the period of time and dividing a resulting product by the voltage change.

15. The supercapacitor health measurement system of claim 11, wherein the memory device further comprises instructions executable by the processing device for causing the processing device to:

receive a first voltage across the supercapacitor at a first time from the voltage measurement device;

receive a first amount of current that is output by the supercapacitor at the first time from the current measurement device;

receive a second voltage across the supercapacitor at a second time from the voltage measurement device;

receive a second amount of current that is output by the supercapacitor at the second time from the current measurement device;

subtract the second voltage from the first voltage to determine change in voltage over the time period between the first time and the second time; and subtract the second amount of current from the first amount of current to determine the change in current over the time period between the first time and the second time.

16. The supercapacitor health measurement system of claim 11, wherein the memory device further comprises instructions executable by the processing device for causing the processing device to:

determine a capacitance value of the supercapacitor;

determine if the capacitance value is different from a baseline capacitance value by an amount above a first threshold;

determine if the ESR value is different from a baseline ESR value by another amount above a second threshold; and transmit data to a remote device in response to at least one of (i) the capacitance value being different from the baseline capacitance value by the amount above the first threshold, or (ii) the ESR value being different from the baseline ESR value by the other amount above the second threshold, wherein the data comprises at least one of the capacitance value or the -ESR value.

17. The supercapacitor health measurement system of claim 16, wherein the data further comprises the voltage across the supercapacitor and a temperature of the supercapacitor.

18. The supercapacitor health measurement system of claim 11, wherein the voltage measurement device and the current measurement device are positioned on a well tool for use in the wellbore.

19. A well tool for use in a wellbore, the well tool comprising:
a supercapacitor for transmitting power to an electronic device of the well tool; and
a supercapacitor health measurement device comprising circuitry electrically coupled to the supercapacitor, wherein the circuitry is configured to:
determine a capacitance of the supercapacitor;
determine an equivalent series resistance (ESR) value of the supercapacitor by dividing (i) a change in voltage across the supercapacitor over a time period by (ii) a change in current output by the supercapacitor over the time period; and
transmit the capacitance and the ESR value to a remote device.

20. The well tool of claim 19, wherein the supercapacitor health measurement device comprises:
a processing device;
a memory device in which instructions executable by the processing device are stored;
a temperature sensor comprising circuitry configured for detecting a temperature of the supercapacitor and transmitting a temperature sensor signal associated with the temperature to the processing device;
a current measurement device comprising circuitry configured for determining an amount of current that is output by the supercapacitor and transmitting an associated current signal to the processing device; and
a voltage measurement device comprising circuitry configured for determining a voltage across the supercapacitor and transmitting a signal associated with the voltage to the processing device.

21. A method comprising:
determining, by a supercapacitor health measurement device positioned on a well tool in a wellbore, a capacitance value for a supercapacitor positioned in the well tool;
determining, by the supercapacitor health measurement device, an equivalent series resistance (ESR) value for the supercapacitor by dividing (i) a change in voltage across the supercapacitor over a time period by (ii) a change in current output by the supercapacitor over the time period; and
transmitting, by the supercapacitor health measurement device, the capacitance value and the ESR value to a remote device positioned at a surface of the wellbore.

22. The method of claim 21, further comprising:
receiving a baseline capacitance value;
receiving a baseline ESR value; and
storing the baseline capacitance value and the baseline ESR value in a memory device.

23. The method of claim 21, further comprising:
receiving a temperature sensor signal indicating a temperature of the supercapacitor from a temperature sensing device;
determining the temperature based on the temperature sensor signal;
determining whether the temperature exceeds a first threshold;
receiving a signal indicating a voltage across the supercapacitor from a voltage measurement device;
determining the voltage across the supercapacitor based on the signal;
determining whether the voltage across the supercapacitor exceeds a second threshold; and
waiting for a predetermined period of time in response to both (i) the temperature being below the first threshold, and (ii) the voltage across the supercapacitor being below the second threshold.

24. The method of claim 23, further comprising:
determining a new capacitance value of the supercapacitor and a new ESR value of the supercapacitor in response to (i) an expiration of the predetermined period of time, or (ii) the temperature exceeding the first threshold or the voltage across the supercapacitor exceeding the second threshold; and
storing the new capacitance value and the new ESR value in a memory device.

25. The method of claim 21, further comprising:
receiving a first voltage across the supercapacitor at a first time from a voltage measurement device;
receiving a second voltage across the supercapacitor at a second time from the voltage measurement device;
receiving an amount of current that is output by the supercapacitor over a period of time between the first time and the second time from a current measurement device;
subtracting the second voltage from the first voltage to determine a change in voltage over the period of time; and
determining the capacitance value by multiplying the amount of current by the period of time and dividing a resulting product by the change in voltage.

26. The method of claim 21, further comprising:
receiving a first voltage across the supercapacitor at a first time from a voltage measurement device;
receiving a first amount of current that is output by the supercapacitor at the first time from a current measurement device;
receiving a second voltage across the supercapacitor at a second time from the voltage measurement device;
receiving a second amount of current that is output by the supercapacitor at the second time from the current measurement device;
subtracting the second voltage from the first voltage to determine a voltage change over a period of time between the first time and the second time;
subtracting the second amount of current from the first amount of current to determine a current change over the period of time between the first time and the second time; and
dividing the voltage change by the current change to determine the ESR value.

27. The method of claim 22, further comprising:
determining if the capacitance value is different from a baseline capacitance value by an amount above a first threshold;
determining if the ESR value is different from a baseline ESR value by another amount above a second threshold; and
transmitting the capacitance value and the ESR value to the remote device in response to at least one of (i) the capacitance value being different from the baseline capacitance value by the amount above the first threshold, or (ii) the ESR value being different from the baseline ESR value by the other amount above the second threshold.

* * * * *